United States Patent
Mailhe et al.

(10) Patent No.: US 9,569,843 B1
(45) Date of Patent: Feb. 14, 2017

(54) PARAMETER-FREE DENOISING OF COMPLEX MR IMAGES BY ITERATIVE MULTI-WAVELET THRESHOLDING

(71) Applicant: Siemens Healthcare GmbH, Erlangen (DE)

(72) Inventors: Boris Mailhe, Plainsboro, NJ (US); Mariappan S. Nadar, Princeton, NJ (US); Stephan Kannengiesser, Wuppertal (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 14/849,391

(22) Filed: Sep. 9, 2015

(51) Int. Cl.
| | |
|---|---|
| *G06K 9/00* | (2006.01) |
| *G06T 7/00* | (2006.01) |
| *G06T 5/00* | (2006.01) |
| *G06T 5/20* | (2006.01) |
| *G06T 5/10* | (2006.01) |
| *G06T 11/00* | (2006.01) |

(52) U.S. Cl.
CPC ............ *G06T 7/0012* (2013.01); *G06T 5/002* (2013.01); *G06T 5/10* (2013.01); *G06T 5/20* (2013.01); *G06T 11/008* (2013.01); *G06T 2207/10088* (2013.01)

(58) Field of Classification Search
None
See application file for complete search history.

(56) References Cited

U.S. PATENT DOCUMENTS

| 7,253,627 B1 * | 8/2007 | Ahmed | G01R 33/56 |
| | | | 324/307 |
| 2008/0247618 A1 * | 10/2008 | Laine | G06F 19/321 |
| | | | 382/128 |

(Continued)

OTHER PUBLICATIONS

Magn Reson Med. Nov. 1999;42(5):952-62. SENSE: sensitivity encoding for fast MRI. Pruessmann KP1, Weiger M, Scheidegger MB, Boesiger P.

(Continued)

*Primary Examiner* — Shervin Nakhjavan

(57) ABSTRACT

A method for denoising Magnetic Resonance Imaging (MRI) data includes receiving a noisy image acquired using an MRI imaging device and determining a noise model comprising a non-diagonal covariance matrix based on the noisy image and calibration characteristics of the MRI imaging device. The noisy image is designated as the current best image. Then, an iterative denoising process is performed to remove noise from the noisy image. Each iteration of the iterative denoising process comprises (i) applying a bank of heterogeneous denoisers to the current best image to generate a plurality of filter outputs, (ii) creating an image matrix comprising the noisy image, the current best image, and the plurality of filter outputs, (iii) finding a linear combination of elements of the image matrix which minimizes a Stein Unbiased Risk Estimation (SURE) value for the linear combination and the noise model, (iv) designating the linear combination as the current best image, and (v) updating each respective denoiser in the bank of heterogeneous denoisers based on the SURE value. Following the iterative denoising process, the current best image is designated as a final denoised image.

20 Claims, 6 Drawing Sheets

(56) References Cited

U.S. PATENT DOCUMENTS

2011/0170796 A1* 7/2011 Qian .................. G06T 5/10
                                                  382/264
2013/0182930 A1* 7/2013 Trzasko ............ G06T 11/003
                                                  382/131
2014/0233826 A1* 8/2014 Agaian ............ A61B 5/7267
                                                  382/133

OTHER PUBLICATIONS

Magn Reson Med. Jun. 2002;47(6):1202-10. Generalized autocalibrating partially parallel acquisitions (GRAPPA). Griswold MA1, Jakob PM, Heidemann RM, Nittka M, Jellus V, Wang J, Kiefer B, Haase A.

* cited by examiner

PARAMETER-FREE DENOISING OF COMPLEX MR IMAGES BY ITERATIVE MULTI-WAVELET THRESHOLDING

TECHNOLOGY FIELD

The present invention relates generally to methods, systems, and apparatuses for performing Magnetic Resonance Imaging (MRI) reconstruction using a parameter-free denoising technique that is applied to iterative multi-wavelet thresholding to complex MRI data. The disclosed techniques may be applied to enhance and simplify existing denoising MRI operations.

BACKGROUND

MR images are acquired in k-space in the Fourier domain. The acquired image data includes white noise. That is, noise in the acquired image data is a signal whose spectrum has equal power within any equal interval of frequencies. In order to transform the raw image data into an image, a reconstruction process is performed. Using a standard linear reconstruction model, one or more filtering operations must be performed during the reconstruction. During each filtering operation, multiplications may be performed to color the noise by making certain frequencies of the noise signal more prominent than others. This creates a modulation of the noise in the Fourier domain.

Following filtering, a coil combination process is performed to combine data acquired from individual coils of the MRI device. Coil combination may also encompass so-called "parallel imaging", in which undersampling artifacts through accelerated acquisition are compensated for via dedicated coil combination coefficients. This combination may also amplify the noise in some region of the space, in the pixel domain. This noise "modulation" is often referred to as "G-factor" noise and may be influenced by the coil geometry, the field of view, the location of the imaging plane, and the sampling pattern used to acquire the k-space data. This creates modulation of the noise in space.

An additional modulation in the noise results from the signal level not being uniform in space. During imaging, a coil array is placed around the subject's body. Signal sensitivity is typically very good close to the coils (i.e., at the periphery of the body); however, sensitivity is poor in the center of image space. So, if an image is reconstructed based on this data, it will have a dark center region. To compensate for the difference in sensitivity, a corrective field may be applied in the pixel domain (i.e., multiply the pixel intensity by some factor in the center); however, this modulates the noise as well.

Accordingly, the noise associated with an MRI acquisition is Gaussian, but modulated in both in the Fourier domain and pixel domain. Conventional denoising techniques are unable to address denoising in this context because these techniques cannot adequately handle noise in the Fourier domain and, at the same time, adapt to varying noise level so denoising of the center of the image does not result in blurring.

SUMMARY

Embodiments of the present invention address and overcome one or more of the above shortcomings and drawbacks, by providing methods, systems, and apparatuses related to a self-tuning iterative denoising algorithm for Magnetic Resonance Imaging (MRI) applications that adjusts its parameters based on the observed image and noise parameters gathered at acquisition.

According to some embodiments of the present invention, a method for denoising MRI data includes receiving a noisy image acquired using an MRI imaging device and determining a noise model comprising a non-diagonal covariance matrix based on the noisy image and calibration characteristics of the MRI imaging device. The noisy image is designated as the current best image. Then, an iterative denoising process is performed to remove noise from the noisy image. Each iteration of the iterative denoising process comprises (i) applying a bank of heterogeneous denoisers to the current best image to generate a plurality of filter outputs, (ii) creating an image matrix comprising the noisy image, the current best image, and the plurality of filter outputs, (iii) finding a linear combination of elements of the image matrix which minimizes a Stein Unbiased Risk Estimation (SURE) value for the linear combination and the noise model, (iv) designating the linear combination as the current best image, and (v) updating each respective denoiser in the bank of heterogeneous denoisers based on the SURE value. Following the iterative denoising process, the current best image is designated as a final denoised image.

The features of the aforementioned method can be refined, supplemented, or otherwise modified in different embodiments of the present invention. In some embodiments, each respective denoiser in the bank of heterogeneous denoisers corresponds to a wavelet filter. For example, in some embodiments, each respective denoiser corresponds to a distinct Daubechies wavelet. In some embodiments, a sequential cycle spinning operation is performed during the iterative denoising process to shift transforms performed by each respective wavelet filter by a predetermined offset value that may vary during each iteration. In some embodiments, one or more denoisers included in the bank of heterogeneous denoisers is configured based on the noise model.

In some embodiments of the aforementioned method, each respective denoiser in the bank of heterogeneous denoisers uses a thresholding operator corresponding to an empirical Wiener filter. For example, in one embodiment, the thresholding operator applies non-negative garrote thresholding. During the aforementioned method, each respective denoiser in the bank of heterogeneous denoisers may be updated by updating the thresholding operator used by each respective denoiser based on the SURE value.

In some embodiments of the aforementioned method, k-space data is acquired using the MRI imaging device. Next, a spatial modulation measurement operator corresponding to the MRI imaging device is determined based on the k-space data. One or more filters are applied to the k-space data to yield filtered k-space data and a spectral measurement operator. The noisy image is reconstructed based on the filtered k-space data. Then, the noise model is generated based on the spatial modulation measurement operator and the spectral measurement operator.

In other embodiments of the aforementioned method, the iterative denoising process further comprises selecting a subset of the filter outputs, where each respective output in the subset corresponds to a recombination weight in the linear combination below a predetermined threshold value. Next, low-weighted denoisers in the bank of heterogeneous denoisers corresponding to the filter outputs are identified. Then, the low-weighted denoisers are removed from the bank of heterogeneous denoisers.

According to other embodiments of the present invention, an article of manufacture for denoising MRI data comprises a non-transitory, tangible computer-readable medium holding computer-executable instructions for performing the aforementioned method, with or without the additional features discussed above.

According to other embodiments, a system for denoising MRI data comprises an MRI imaging device configured to acquire k-space data and a computer comprising an image data processor. The image data processor is configured to reconstruct a noisy image based on the k-space data, determine a noise model comprising a non-diagonal covariance matrix based on the noisy image and calibration characteristics of the MRI imaging device, designate the noisy image as a current best image, and perform an iterative denoising process to remove noise from the noisy image. Each iteration of the iterative denoising process comprises (i) applying a bank of heterogeneous denoisers to the current best image to generate a plurality of filter outputs, (ii) creating an image matrix comprising the noisy image, the current best image, and the plurality of filter outputs, (iii) finding a linear combination of elements of the image matrix which minimizes a SURE value for the linear combination and the noise model, (iv) designating the linear combination as the current best image, and (v) updating each respective denoiser in the bank of heterogeneous denoisers based on the SURE value. Following the iterative denoising process, the image data processor designates the current best image as a final denoised image.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses related to performing Magnetic Resonance Imaging (MRI) reconstruction using a parameter-free denoising technique that apply iterative multi-wavelet thresholding to complex MRI data. Briefly, the techniques described herein use a self-tuning iterative denoising algorithm that adjusts its parameters based on the observed image and noise parameters gathered at acquisition. During each iteration, the current iterate is filtered by a bank of wavelet denoisers, using an empirical Wiener filter to adapt to the noise level. Then, the different filter outputs are recombined among each other, as well as with the previous iterate and the original image to adjust the global filtering strength. The recombination weights may be computed on the fly to minimize Stein's Unbiased Risk Estimation (SURE), which allows the algorithm to adapt to the image and noise contents. The SURE value itself also provides an estimate of the residual noise variance in the current iterate, which can be used in the next iteration to adjust the thresholds. To reduce computational costs, decimated wavelets may be used in the individual denoisers, but with different shifts at each iteration so that the overall denoising benefits from the whole undecimated transform.

The iterative denoising process includes several developments which distinguish it from conventional denoising techniques in order to efficiently apply SURE to the denoising of MRI images. For example, because the images being denoised are complex, the SURE linear expansion is expanded to complex coefficients by considering the real and imaginary parts separately. Additionally, the noise in MR images is modulated not only in voxel domain, but also in k-space due to filtering steps applied before reconstruction. This results in a noise model where the axes of the noise covariance may be unknown. To address this, SURE is extended to manipulate covariance operators in an abstract way instead of relying on a diagonal form.

Figure 1:
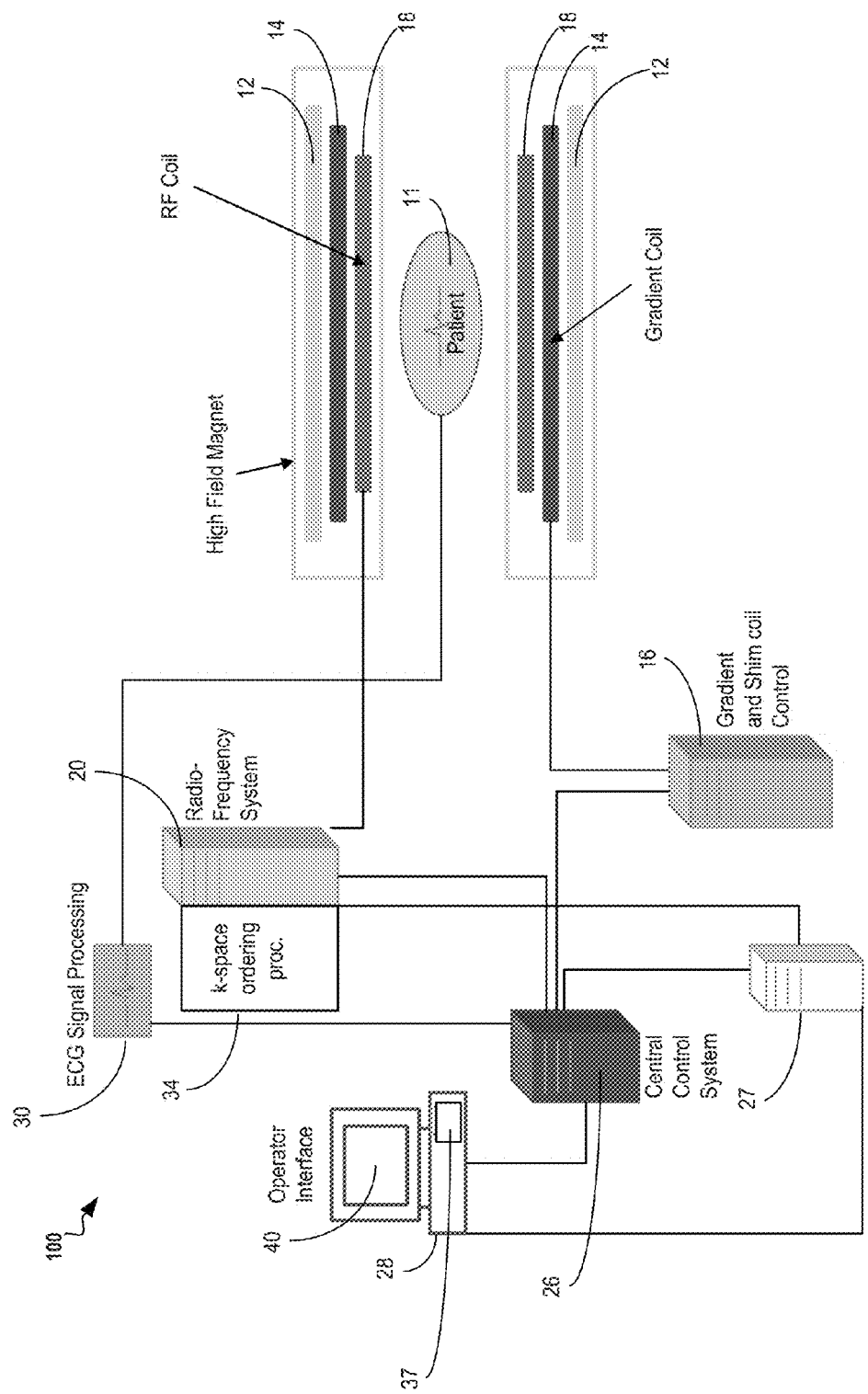
FIG. 1 shows a system for ordering acquisition of frequency domain components representing magnetic resonance image data for storage in a k-space storage array, as used by some embodiments of the present invention.

FIG. 1 shows a system 100 for ordering acquisition of frequency domain components representing MRI data for storage in a k-space storage array, as used by some embodiments of the present invention. This system 100 is sometimes referred to herein collectively as the "MRI Scanner." In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MRI device magnetic field resulting from patient anatomical variation and other sources. The magnetic field gradients include a slice-selection gradient magnetic field, a phase-encoding gradient magnetic field and a readout gradient magnetic field that are applied to patient 11.

Further radio frequency (RF) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 receives magnetic resonance signals, i.e., signals from the excited protons within the body as they return to an equilibrium position established by the static and gradient magnetic fields. The magnetic resonance signals are detected and processed by a detector within RF module 20 and k-space component processor unit 34 to provide a magnetic resonance dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising a magnetic resonance dataset. The k-space array of individual data elements has a designated center and individual data elements individually have a radius to the designated center.

A magnetic field generator (comprising coils 12, 14, and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of a magnetic resonance dataset representing an magnetic resonance image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected magnetic resonance signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the magnetic resonance signals to reconstruct one or more images for presentation on display 40, for example. Various techniques may be used for reconstruction. For example, as described in greater detail below, an optimization algorithm is applied to iteratively solve a cost function which results in the reconstructed image.

Figure 2:
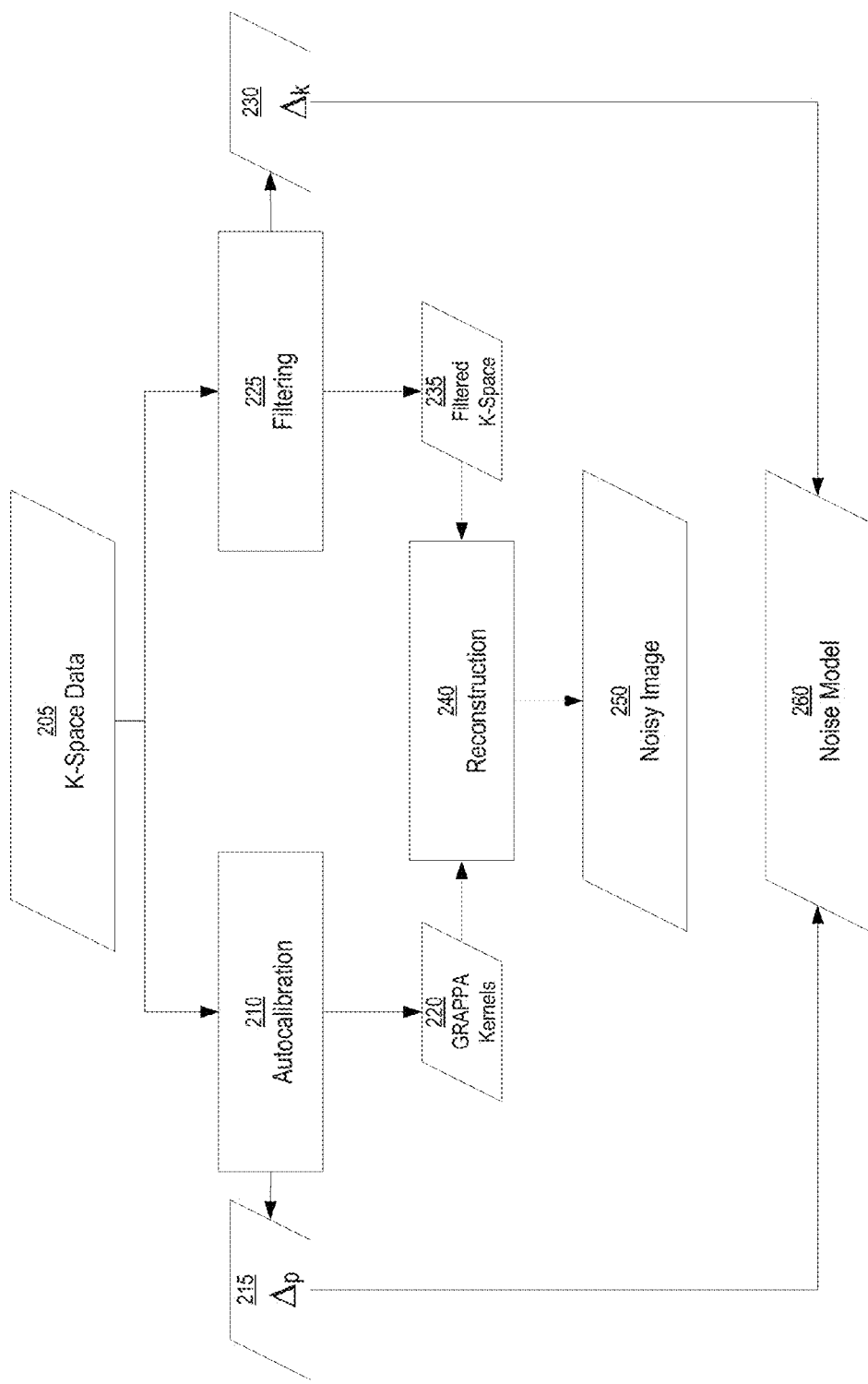
FIG. 2 illustrates a process for generating a noisy image and a noise model during MRI acquisition, according to some embodiments.

FIG. 2 illustrates a process 200 for generating a Noisy Image 250 and a Noise Model 260 during MRI acquisition, according to some embodiments. K-Space Data 205 is acquired, as described above with reference to FIG. 1. At the MRI Scanner an Autocalibration Process 210 is performed. The Autocalibration Process 210 produces Generalized Autocalibrating Partially Parallel Acquisition (GRAPPA) Kernels 220. As is generally understood in the art, GRAPPA is a parallel imaging technique to speed up MRI pulse sequences. GRAPPA introduces G-Factor noise modulation in the voxel space. This noise modulation is captured by the Autocalibration Process 210 and represented in FIG. 2 by Spatial Modulation Measurement 215. Additionally, a residual bias field may also be captured in the Spatial Modulation Measurement 215.

Continuing with reference to FIG. 2, a Filtering Process 225 is also applied to K-Space Data 205 to produce Filtered K-Space Data 235. Using a standard linear reconstruction model, the Filtering Process 225 performs multiplications which color the noise in the K-Space Data 205 by making certain frequencies of the noise signal more prominent than others. This creates a modulation of the noise in the Fourier domain which is represented in FIG. 2 by Spectral Modulation Measurement 230.

Using the GRAPPA Kernels 220 and the Filtered K-Space Data 235, a Reconstruction Process 240 may be performed to result in a Noisy Image 250. Notably, at this point, little or no denoising may have been performed on the data. However, the Spatial Modulation Measurement 215 and the Spectral Modulation Measurement 230 may be used to create a Noise Model 260 which, as described below in reference to FIG. 3, may be used to denoise the image.

$$X \sim N(X_0, \Sigma^2) \quad (1)$$

$$\Sigma^2 = \Delta_p F^{-1} \Delta_k^2 F \Delta_p \quad (2)$$

In these equations F is the Fourier transform, $\Delta_k$ and $\Delta_p$ represent the Spatial Modulation Measurement 215 and the Spectral Modulation Measurement 230, respectively. X is the signal (i.e., images) and $X_0$ is the ground truth (i.e., the denoised image). $\Sigma^2$ is the covariance of the noise.

Figure 3:
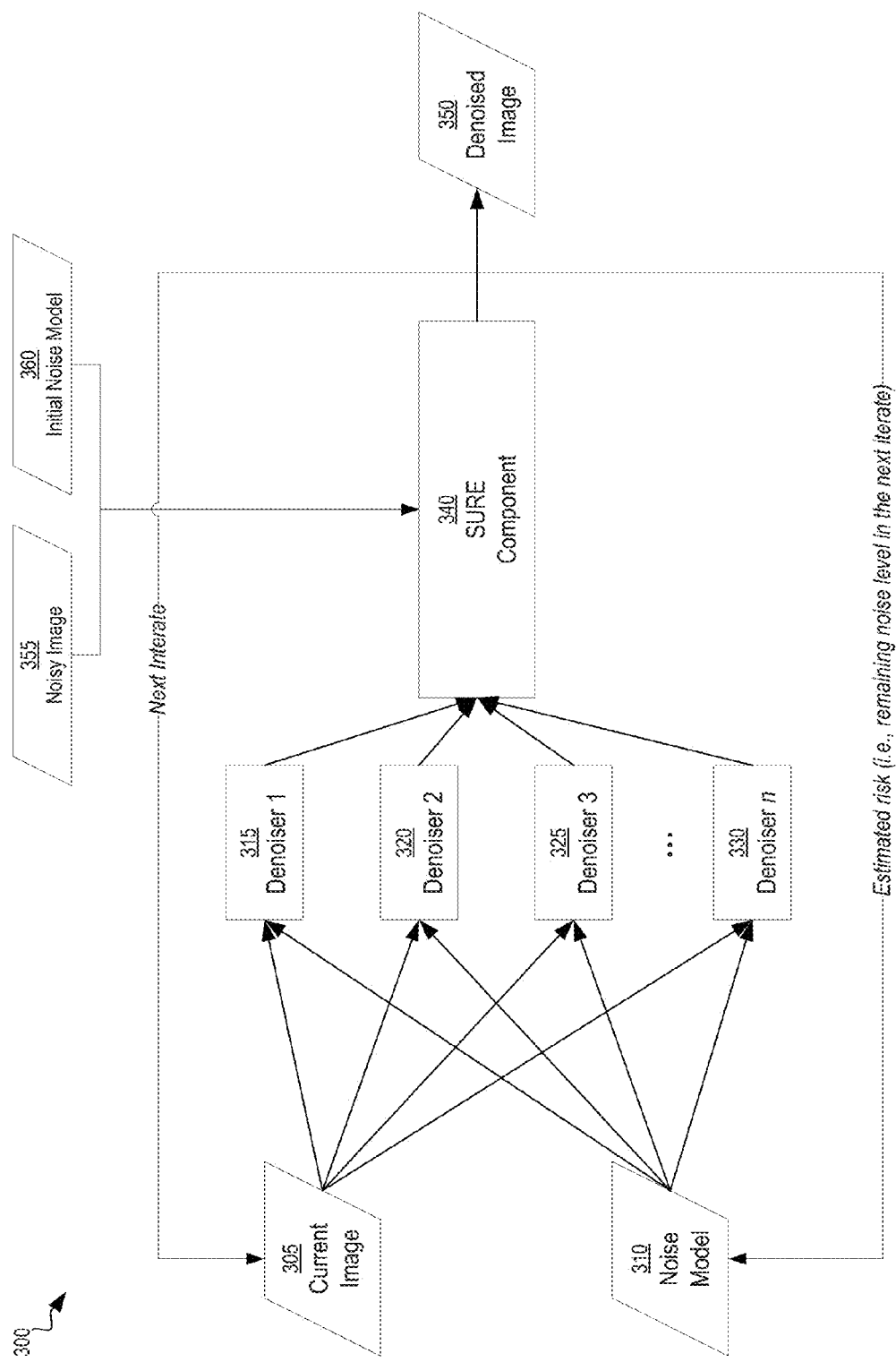
FIG. 3 provides an overview of an iterative denoising process that may be applied to denoise an image, according to some embodiments.

FIG. 3 provides an overview of an iterative denoising process 300 that may be applied to denoise an image, according to some embodiments. This process 300 may be implemented, for example, by a computer using the image data processor described above with reference to FIG. 1. The initial inputs to the process are the Noisy Image 355 and the Initial Noise Model 360. These two items may be generated using the process 200 described above with reference to FIG. 2. The Noisy Image 355 and the Initial Noise Model 360 serve as the Current Image 305 and the Noise Model 310 for the first iteration of the iterative denoising process 200.

During each iteration of the iterative denoising process 300, Denoisers 315, 320, 325, 330 are applied to the Current Image 305 and the Noise Model 310. It should be noted that, although four denoisers are shown in FIG. 3, a greater or smaller number of denoisers may be used in other embodiments. The Denoisers 315, 320, 325, 330 are "atomic" in the sense that they operate independently.

Any type of denoiser may be used in the process 300 shown in FIG. 3. For example, in some embodiments, the Denoisers 315, 320, 325, 330 are simple orthogonal wavelet thresholding filters where wavelet coefficient values not exceeding a selected threshold level are replaced by zero followed by an inverse transform of modified coefficients to recover denoised signal. This may be represented as follows:

$$x \leftarrow W^T S_\alpha W x \quad (3)$$

In Equation 3, W is a wavelet transform with three levels. For example, in one embodiment, the denoising filters are Daubechies 1 to 8. Each Denoiser 315, 320, 325, 330 denoises the image in a slightly different way. Additionally, the wavelet applied by each of the Denoisers 315, 320, 325, 330 introduces some artifacts. For example, for a Haar wavelet filter, the filtered image may include some "staircasing" such that it appears piece-wise constant. With higher order wavelet filters there may be some "ringing" where there are ripples around certain edges in the image. By using different filters, these different artifacts may be cancelled out, thus resulting in an image with less overall noise. S in Equation 3 is a non-negative garrote thresholding operator that corresponds to an empirical Wiener filter. The parameter may be determined directly from the noise level as follows:

$$S_\sigma(x) = \frac{\max(|x|^2 - \sigma^2, 0)}{|x|^2} x \tag{4}$$

Here, $\sigma^2$ is the variance of the noise level. In some embodiments, sequential cycle spinning is used to shift the transforms performed by the filters by a different offset at each iteration. This provides the quality of redundant transforms for the cost of orthogonal ones and avoids blocking artifacts.

The results generated by Denoisers 315, 320, 325, 330 are combined via a Stein Unbiased Risk Estimation (SURE) Component. SURE is an estimation technique generally known in the art and, thus, only briefly described here. Let $x \sim N(x_0, \sigma^2)$ be a noisy observation of $x_0$ and let $h(x)$ be a denoiser (i.e., an estimator of $x_0$, given x). The quality of h can be measured by quadratic risk as follows: $R(h)=E(\|h(x)-x_0\|^2)$. However, in general, $x_0$ is unknown and the risk can only be computed on synthetic data. SURE avoids computation of $x_0$ by providing an estimator of risk that only depends on x. Continuing with the notation set out above, the general form of SURE may be expressed by:

$$\text{SURE}(h, x) = \|h(x) - x\|^2 - \sigma^2 + 2\sigma^2 \frac{\partial h}{\partial x}(x) \tag{5}$$

This may be generalized to dimension N with white Gaussian noise (or diagonal covariance) as follows:

$$\text{SURE}(H,X)=\|H(X)-X\|^2-N\sigma^2+2\sigma^2 \text{ div } H(x) \tag{6}$$

In MRI applications, the noise is not white and must be represented by a non-diagonal covariance. For such applications, the generalization described in Equation 6 is not applicable. Rather, Equation 5 is generalized as follows:

$$\text{SURE}(H,X)=\|H(X)-X\|^2-Tr(\Sigma^2)+2 \text{ div } \Sigma^2 H(x) \tag{7}$$

Equation 7 may further be generalized to complex numbers (such as available in MRI applications) by considering each complex variable as a pair of real variables with independent and identically distributed (i.i.d.) noise.

SURE-LET is the accepted name of SURE applied to a linear model combination. For atomic denoisers (such as Denoisers 315, 320, 325, 330), one gets n images plus the noisy one and the previous iterate: $Y=[X_1 \ldots X_N]$. Based on this data, one may determine the recombination weights that minimize SURE via a simple low-dimension least-square problem as follows:

$$\hat{\lambda}=\text{argmin}_\lambda \|Y\lambda-X\|^2-Tr(\Sigma^2)+2 \text{ div } \Sigma^2 Y\lambda(x) \tag{8}$$

$$=\text{argmin}_\lambda \|Y\lambda-X\|^2-Tr(\Sigma^2)+2<\lambda,[\text{ div } \Sigma^2 X_n(X)]_{1\le n\le N}> \tag{9}$$

$$=(Y^T Y)^{-1}(Y^T X-[\text{ div } \Sigma^2 X_n(X)]_{1\le n\le N}) \tag{10}$$

To simplify matters further, in some embodiments, these equations may be constrained, for example, by limiting the computations to real weight values and/or only positive weight values.

Closed-form derivation of Equation 10 would require differentiation of the denoising process with respect to the input image, which is intractable for iterative methods as the chain rule introduces large-scale spatial dependencies. Instead, the SURE Component 340 may perform the SURE Monte Carlo method where derivatives are approximated by the difference between the denoising of the actual image and an image with slightly more noise added:

$$\Delta \text{ i.i.d.} \sim N(0,1) \tag{11}$$

$$\epsilon \ll 1 \tag{12}$$

$$\text{div} \sum^2 H(X) \approx \frac{1}{\epsilon} \left\{ \sum^2 H(X+\epsilon\Delta) - \sum^2 H(X), \Delta \right\} \tag{13}$$

To track the risk over iterations, $\Delta$ is drawn once at the beginning of the algorithm and the images X and X+$\epsilon\lambda$ are denoised simultaneously. The overhead cost is compensated by the adaptive step size that ensures optimal convergence speed of the algorithm.

The SURE Component 340 generates a denoised image 350 which may be used as the Current Image 305 for the next iterate. Additionally, the SURE Component 340 provides a measure of estimate risk (i.e., the remaining noise level in the next iterate). This information is used to refine the Noise Model 310 for use in the next iteration.

The iterative denoising process 300 repeats for a predetermined number of iterations (e.g., supplied by a user) or until some threshold based criteria is reached (e.g., estimate risk below a certain value). In some embodiments, the weight values provided by SURE may be used to reduce the number of filters used for later iterations. For example, all filters with weight values below a threshold value may be eliminated from further process. This helps to accelerate the overall processing time of the iterative denoising process 300. Once the iterative denoising process 300 is complete, the denoised image 350 is the final denoised image.

The iterative denoising process 300 described in FIG. 3 operates on complex data. Thus, the Denoisers 315, 320, 325, 330 and the SURE Component 340 are able to leverage phase information and avoid Rician effects. It should also be noted that the iterative denoising process 300 is self-tuning. Empirical Wiener filtering matches thresholds to local noise levels and SURE recombination adapts weights of different filters and algorithm step size. The result is uniform over space and, because the noise model is gathered at the scanner (see FIG. 2), no user input is required. Additionally, because multiple filters are used, the iterative denoising process 300 provides the benefits of multi-model fusion (e.g., minimizing regularization artifacts).

Figure 4A:
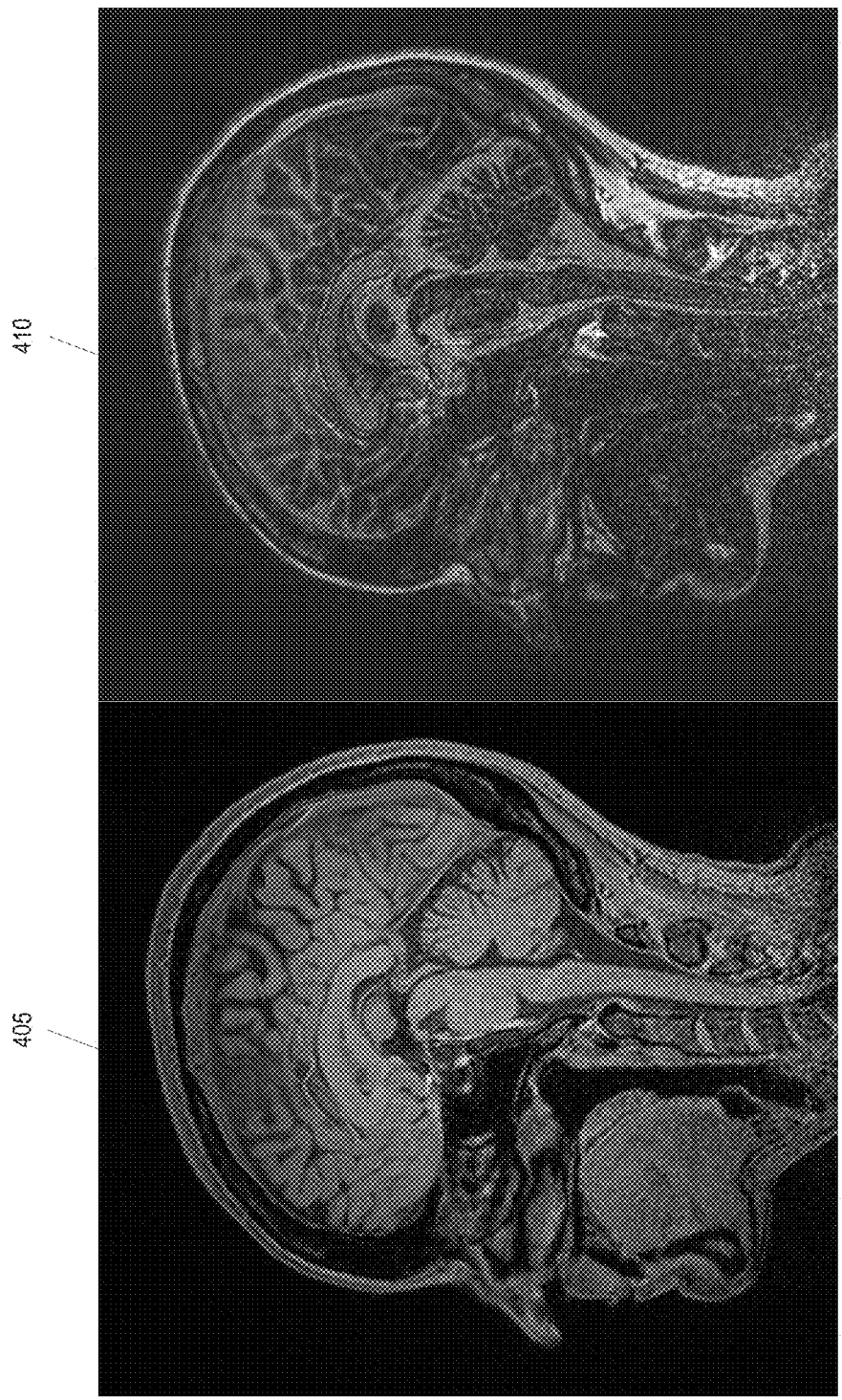
FIG. 4A shows two images acquired using an MP2RAGE sequence for two different contrast levels where no denoising is applied.
Figure 4B:
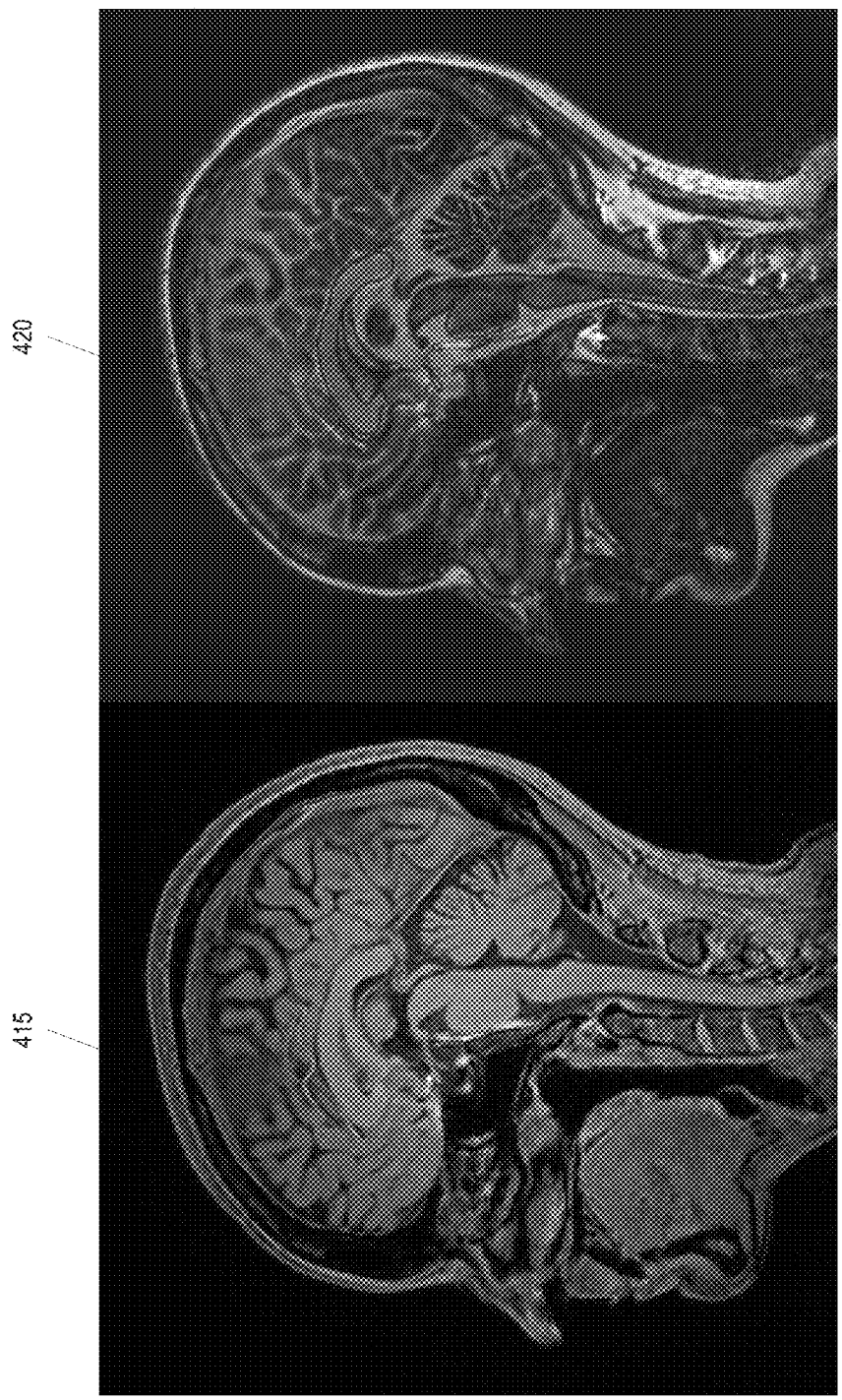
FIG. 4B shows the two denoised image corresponding to the images shown in FIG. 4A, where the denoising is performed using the techniques described herein.

FIGS. 4A and 4B show a set of images which demonstrate the benefits of denoising using the techniques described above with respect to FIGS. 2 and 3. More specifically, FIG. 4A shows two images 405, 410 acquired using an MP2RAGE sequence for two different contrast levels where no denoising is applied. FIG. 4B shows two images 415, 420 demonstrating the effect of applying the iterative denoising process described herein. Note that the signal and noise of images can vary greatly from one contrast level to the next. Thus, the denoising effects shown in FIG. 4B demonstrates that the iterative denoising process is robust such that it can adapt to the changes and still provide high-quality denoising.

Figure 5:
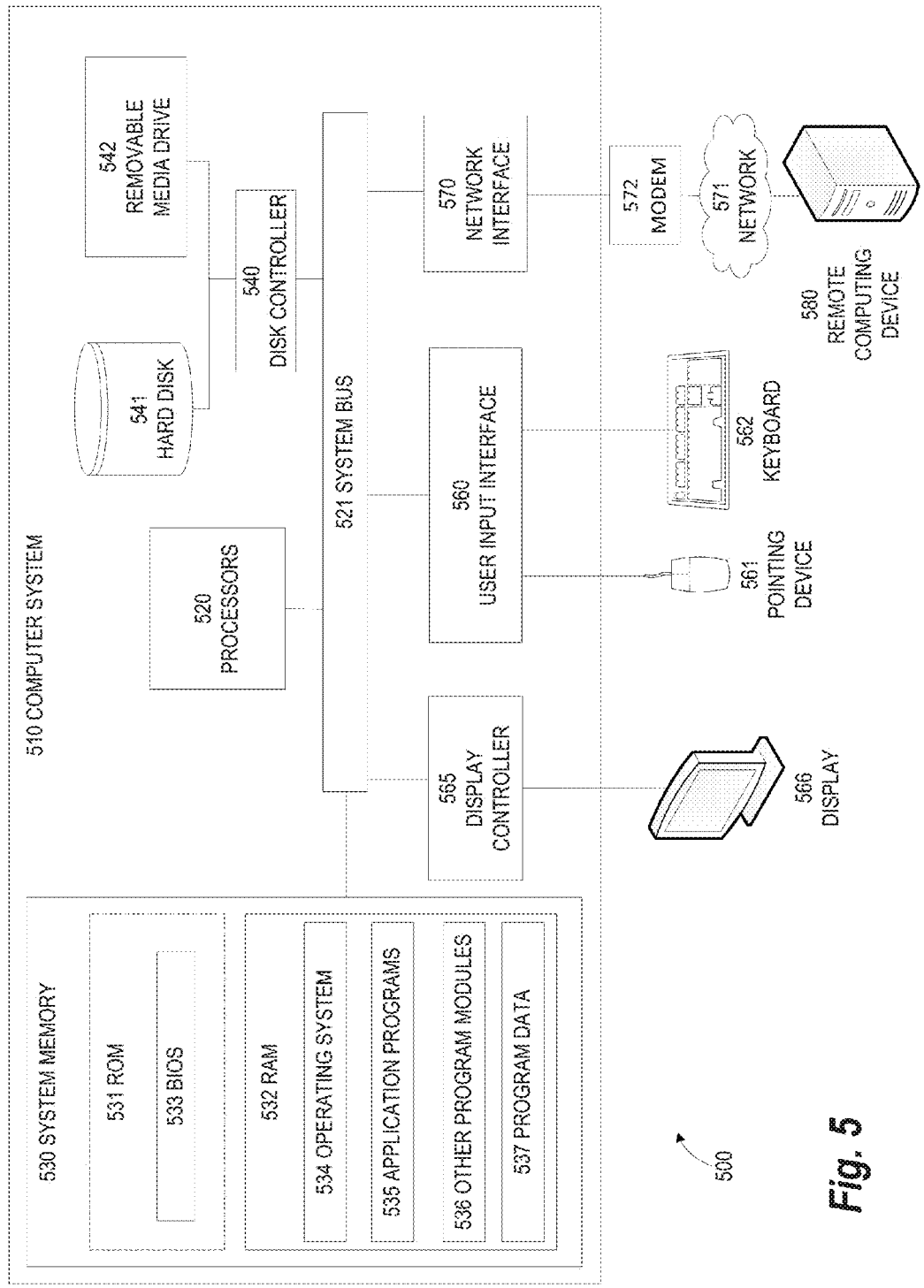
FIG. 5 illustrates an exemplary computing environment within which embodiments of the invention may be implemented.

FIG. 5 illustrates an exemplary computing environment 500 within which embodiments of the invention may be implemented. For example, this computing environment 500 may be used to implement the processes 200, 300, described in FIGS. 2, and 3, respectively. In some embodiments, the computing environment 500 may be used to implement one or more of the components illustrated in the system 100 of FIG. 1. The computing environment 500 may include computer system 510, which is one example of a computing system upon which embodiments of the invention may be implemented. Computers and computing environments, such as computer system 510 and computing environment 500, are known to those of skill in the art and thus are described briefly here.

As shown in FIG. 5, the computer system 510 may include a communication mechanism such as a bus 521 or other communication mechanism for communicating information within the computer system 510. The computer system 510 further includes one or more processors 520 coupled with the bus 521 for processing the information. The processors 520 may include one or more central processing units (CPUs), graphical processing units (GPUs), or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system (BIOS) 533 containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display 566, such as a cathode ray tube (CRT) or liquid crystal display (LCD), for displaying information to a computer user. The computer system includes an input interface 560 and one or more input devices, such as a keyboard 562 and a pointing device 561, for interacting with a computer user and providing information to the processor 520. The pointing device 561, for example, may be a mouse, a trackball, or a pointing stick for communicating direction information and command selections to the processor 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any medium that participates in providing instructions to the processor 520 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 510 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computer 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for."

We claim:

1. A method for denoising Magnetic Resonance Imaging (MRI) data, the method comprising:
   receiving a noisy image acquired using an MRI imaging device;
   determining a noise model comprising a non-diagonal covariance matrix based on the noisy image and calibration characteristics of the MRI imaging device;
   designating the noisy image as a current best image;
   performing an iterative denoising process to remove noise from the noisy image, each iteration of the iterative denoising process comprising:
      applying a bank of heterogeneous denoisers to the current best image to generate a plurality of filter outputs,
      creating an image matrix comprising the noisy image, the current best image, and the plurality of filter outputs,
      finding a linear combination of elements of the image matrix which minimizes a Stein Unbiased Risk Estimation (SURE) value for the linear combination and the noise model,
      designating the linear combination as the current best image,
      updating each respective denoiser in the bank of heterogeneous denoisers based on the SURE value; and
   following the iterative denoising process, designating the current best image as a final denoised image.

2. The method of claim 1, wherein each respective denoiser in the bank of heterogeneous denoisers corresponds to a wavelet filter.

3. The method of claim 2, wherein each respective denoiser in the bank of heterogeneous denoisers corresponds to a distinct Daubechies wavelet.

4. The method of claim 2, wherein the iterative denoising process further comprising:
   performing a sequential cycle spinning operation to shift transforms performed by each respective wavelet filter by a predetermined offset value.

5. The method of claim 4, wherein the predetermined offset value varies during each iteration of the iterative denoising process.

6. The method of claim 1, wherein each respective denoiser in the bank of heterogeneous denoisers uses a thresholding operator corresponding to an empirical Wiener filter.

7. The method of claim 6, wherein the thresholding operator applies non-negative garrote thresholding.

8. The method of claim 6, wherein updating each respective denoiser in the bank of heterogeneous denoisers based on the SURE value comprises:
   updating the thresholding operator used by each respective denoiser based on the SURE value.

9. The method of claim 1, further comprising:
acquiring k-space data using the MRI imaging device;
determining a spatial modulation measurement operator corresponding to the MRI imaging device based on the k-space data;
applying one or more filters to the k-space data to yield filtered k-space data and a spectral measurement operator;
reconstructing the noisy image based on the filtered k-space data;
generating the noise model based on the spatial modulation measurement operator and the spectral measurement operator.

10. The method of claim 1, wherein one or more denoisers included in the bank of heterogeneous denoisers is configured based on the noise model.

11. The method of claim 1, wherein the iterative denoising process further comprises:
selecting a subset of the plurality of filter outputs, wherein each respective output in the subset corresponds to a recombination weight in the linear combination below a predetermined threshold value;
identifying one or more low-weighted denoisers in the bank of heterogeneous denoisers corresponding to the plurality of filter outputs; and
removing the one or more low-weighted denoisers from the bank of heterogeneous denoisers.

12. An article of manufacture for denoising Magnetic Resonance Imaging (MRI) data, the article of manufacture comprising a non-transitory, tangible computer-readable medium holding computer-executable instructions for performing a method comprising:
receiving a noisy image acquired using an MRI imaging device;
determining a noise model comprising a non-diagonal covariance matrix based on the noisy image and calibration characteristics of the MRI imaging device;
designating the noisy image as a current best image;
performing an iterative denoising process to remove noise from the noisy image, each iteration of the iterative denoising process comprising:
applying a bank of heterogeneous denoisers to the current best image to generate a plurality of filter outputs,
creating an image matrix comprising the noisy image, the current best image, and the plurality of filter outputs,
finding a linear combination of elements of the image matrix which minimizes a Stein Unbiased Risk Estimation (SURE) value for the linear combination and the noise model,
designating the linear combination as the current best image,
updating each respective denoiser in the bank of heterogeneous denoisers based on the SURE value; and
following the iterative denoising process, designating the current best image as a final denoised image.

13. The article of manufacture of claim 12, wherein each respective denoiser in the bank of heterogeneous denoisers corresponds to a wavelet filter.

14. The article of manufacture of claim 13, wherein the iterative denoising process further comprising:
performing a sequential cycle spinning operation to shift transforms performed by each respective wavelet filter by a predetermined offset value that varies during each iteration of the iterative denoising process.

15. The article of manufacture of claim 12, wherein each respective denoiser in the bank of heterogeneous denoisers uses a thresholding operator corresponding to an empirical Wiener filter.

16. The article of manufacture of claim 15, wherein the thresholding operator applies non-negative garrote thresholding.

17. The article of manufacture of claim 15, wherein updating each respective denoiser in the bank of heterogeneous denoisers based on the SURE value comprises:
updating the thresholding operator used by each respective denoiser based on the SURE value.

18. The article of manufacture of claim 12, wherein the method further comprises:
receiving k-space data acquired using the MRI imaging device;
determining a spatial modulation measurement operator corresponding to the MRI imaging device based on the k-space data;
applying one or more filters to the k-space data to yield filtered k-space data and a spectral measurement operator;
reconstructing the noisy image based on the filtered k-space data;
generating the noise model based on the spatial modulation measurement operator and the spectral measurement operator.

19. The article of manufacture of claim 12, wherein one or more denoisers included in the bank of heterogeneous denoisers is configured based on the noise model.

20. A system for denoising Magnetic Resonance Imaging (MRI) data, the system comprising:
an MRI imaging device configured to acquire k-space data;
a computer comprising an image data processor configured to:
reconstruct a noisy image based on the k-space data,
determine a noise model comprising a non-diagonal covariance matrix based on the noisy image and calibration characteristics of the MRI imaging device;
designate the noisy image as a current best image;
perform an iterative denoising process to remove noise from the noisy image, each iteration of the iterative denoising process comprising:
(i) applying a bank of heterogeneous denoisers to the current best image to generate a plurality of filter outputs,
(ii) creating an image matrix comprising the noisy image, the current best image, and the plurality of filter outputs,
(iii) finding a linear combination of elements of the image matrix which minimizes a Stein Unbiased Risk Estimation (SURE) value for the linear combination and the noise model,
(iv) designating the linear combination as the current best image,
(v) updating each respective denoiser in the bank of heterogeneous denoisers based on the SURE value; and
following the iterative denoising process, designate the current best image as a final denoised image.

* * * * *